(12) United States Patent
Bedell et al.

(10) Patent No.: US 9,722,039 B2
(45) Date of Patent: Aug. 1, 2017

(54) FABRICATING HIGH-POWER DEVICES

(71) Applicant: International Business Machines Corporation, Armonk, NY (US)

(72) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/986,506

(22) Filed: Dec. 31, 2015

(65) Prior Publication Data

US 2017/0194456 A1   Jul. 6, 2017

(51) Int. Cl.
| | |
|---|---|
| H01L 29/86 | (2006.01) |
| H01L 29/66 | (2006.01) |
| H01L 21/02 | (2006.01) |
| H01L 21/683 | (2006.01) |
| H01L 21/3065 | (2006.01) |
| H01L 29/20 | (2006.01) |
| H01L 29/868 | (2006.01) |

(52) U.S. Cl.
CPC .... *H01L 29/66204* (2013.01); *H01L 21/0254* (2013.01); *H01L 21/3065* (2013.01); *H01L 21/6835* (2013.01); *H01L 29/2003* (2013.01); *H01L 29/66121* (2013.01); *H01L 29/868* (2013.01)

(58) Field of Classification Search
CPC ........... H01L 29/2003; H01L 29/66462; H01L 29/0646; H01L 29/32; H01L 29/8611
USPC ................................ 257/76, 77, 98, 103, 13
See application file for complete search history.

(56) References Cited

U.S. PATENT DOCUMENTS

| | | | |
|---|---|---|---|
| 2010/0311250 A1 | 12/2010 | Bedell et al. | |
| 2013/0032810 A1* | 2/2013 | Chen .................... | H01L 33/007 257/76 |
| 2013/0126890 A1* | 5/2013 | Bedell ................... | H01L 27/156 257/76 |

* cited by examiner

*Primary Examiner* — Chuong A Luu
*Assistant Examiner* — Rodolfo D Fortich
(74) *Attorney, Agent, or Firm* — Cantor Colburn LLP; Louis Percello

(57) ABSTRACT

According to an embodiment of the present invention, a method for fabricating a semiconductor device comprises depositing a transition layer on a substrate, depositing GaN material on the transition layer, forming a contact on the GaN material, depositing a stressor layer on the GaN material, separating the transition layer and the substrate from the GaN material, patterning and removing portions of the GaN material to expose portions of the stressor layer.

18 Claims, 9 Drawing Sheets

US 9,722,039 B2

FABRICATING HIGH-POWER DEVICES

BACKGROUND

The present invention generally relates to semiconductor devices, and more specifically, to high-power semiconductor devices.

In high-power devices, for example GaN related high-power devices, a plurality of devices are formed on a substrate wafer. Following the fabrication of the devices on the wafer, the individual devices are separated into individual devices using an etching process. Etching GaN materials can be challenging because the GaN-based materials are chemically inert. Thus, the etching processes often include using a Cl-based reactive ion etching process.

SUMMARY

According to an embodiment of the present invention, a method for fabricating a semiconductor device comprises depositing a transition layer on a substrate, depositing GaN material on the transition layer, forming a contact on the GaN material, depositing a stressor layer on the GaN material, separating the transition layer and the substrate from the GaN material, patterning and removing portions of the GaN material to expose portions of the stressor layer.

According to another embodiment of the present invention, a method for fabricating a semiconductor device comprises depositing a transition layer on a substrate, depositing a first semiconductor layer on the transition layer, depositing a second semiconductor layer on the first semiconductor layer, depositing a third semiconductor layer on the second semiconductor layer, forming a contact on the third semiconductor layer, depositing a stressor layer on the third semiconductor layer, separating the transition layer and the substrate from the first semiconductor layer, and removing portions of the first semiconductor layer, the second semiconductor layer, and the third semiconductor layer.

According to another embodiment of the present invention, a semiconductor device comprising a stressor layer, a contact arranged on the stressor layer, a first layer of GaN material arranged on the contact, a second layer of GaN material arranged on the first layer of GaN material, a third layer of GaN material arranged on the second layer of GaN material, and a second contact arranged on the third layer of GaN material.

BRIEF DESCRIPTION OF THE DRAWINGS

FIG. 1 illustrates a side view of a structure that includes a substrate comprising an oxide.

FIG. 2 illustrates a side view of the resultant structure following the formation of conductive contacts.

FIG. 3 illustrates a side view of the resultant structure following the formation of an adhesion layer.

FIG. 4 illustrates a side view of the resultant structure following the formation of a stressor layer.

FIG. 5 illustrates a side view of the resultant structure following the formation of a handle layer.

FIG. 6 illustrates a side view of the resultant structure following a spalling process that separates the substrate and the transition layer.

FIG. 7 illustrates a rotated side view of the resultant structure where a frame has been secured to the handle.

FIG. 8 illustrates a side view of the resultant structure following the deposition and patterning of contact or masking regions.

FIG. 9. Illustrates a side view of the resultant structure following an anisotropic etching process.

FIG. 11 shows a side view of a contact stamp 1102 is arranged in contact with the first semiconductor layer 106.

FIG. 12 illustrates a side view of the resultant structure following a suitable etching process which exposes portions of the underlying stressor layer.

FIG. 13 illustrates a side view of the resultant structure following the removal of the contact stamp of FIG. 12.

DETAILED DESCRIPTION

In high-power devices, for example GaN related high-power devices, often include diode and transistor structures, a plurality of the devices are formed on a substrate wafer. Following the fabrication of the devices on the wafer, the individual devices are separated into individual devices using an etching process. Etching GaN materials can be challenging because the GaN-based materials are chemically inert. Thus, the etching processes often include using a Cl-based reactive ion etching process.

The reactive ion etching process used to etch GaN-based materials is particularly aggressive, and may result in near-surface damage of the GaN lattice. The damage to the GaN lattice can cause undesirable parasitic leakage in the exposed sidewalls of the devices. GaN materials is often grown on a non-native substrate such as, for example, $Al_2O_3$, which makes forming electrical and thermal contact to the underside of the devices challenging. These fabrication challenges may limit the maximum power ratings of the resultant devices.

The methods and resultant structures described herein overcome the challenges described above, and offer improved high-power electronic devices.

FIGS. 1-9 illustrate an exemplary fabrication method for semiconductor devices.

Figure 1:
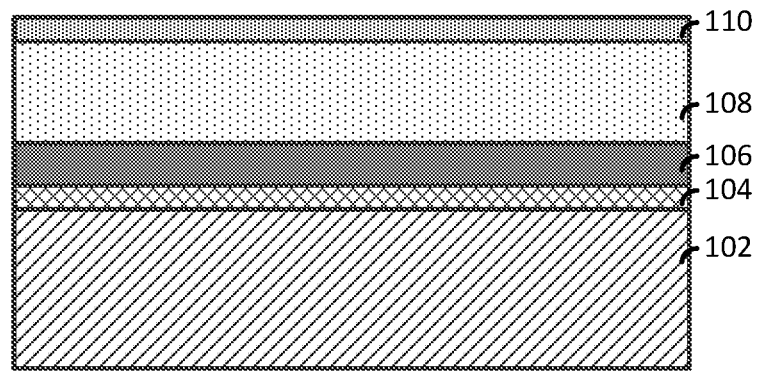
FIGS. 1-9 illustrate an exemplary fabrication method for semiconductor devices.

FIG. 1 illustrates a side view of a structure that includes a substrate 102 comprising an oxide such as, for example, $Al_2O_3$. Alternate materials for substrate 102 include, but are not limited to, SiC, Si, or bulk GaN. A transition layer 104 is arranged on the substrate 102. The transition layer 104 may include, for example, AlN or GaN that may be grown at low-temperature of less than about 700° C. A first semiconductor layer 106 is arranged on the transition layer 104. The first semiconductor layer 106 may include, for example, a doped (e.g., n-type or p-type doped) GaN material having a thickness of about 0.1 to 5 μm. A second semiconductor layer 108 is arranged on the first semiconductor layer 106. The second semiconductor layer 108 includes, for example, an undoped GaN material. The semiconductor layer 108 may have a thickness that is between about 1 and 20 μm and may be undoped or comprise alternating doped and undoped regions. A third semiconductor layer 110 is arranged on the second semiconductor layer 108. The third semiconductor layer 110 includes, for example, a doped (e.g., n-type or p-type doped) GaN material. The third semiconductor layer 110 may have a thickness that is between approximately 0.05 and 1 µm.

Figure 2:
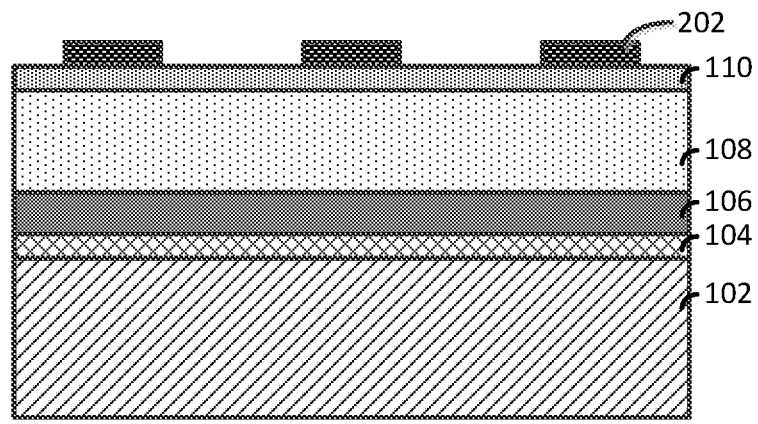

FIG. 2 illustrates a side view of the resultant structure following the formation of conductive contacts 202 on the third semiconductor layer 110. The conducive contacts may 202 include, for example, a Ni, Au or Ag (alone or in combination) material that is deposited on the third semiconductor layer 110 by, for example, physical vapor deposition (PVD) such as thermal evaporation, sputtering or a chemical vapor deposition (CVD) process. The contacts 202 are formed by a lithographic patterning and etching process that removes portions of the material to form the contacts 202. The contacts 202 can also be formed using a shadow mask during deposition, or using a photolithographic lift-off process.

Figure 3:
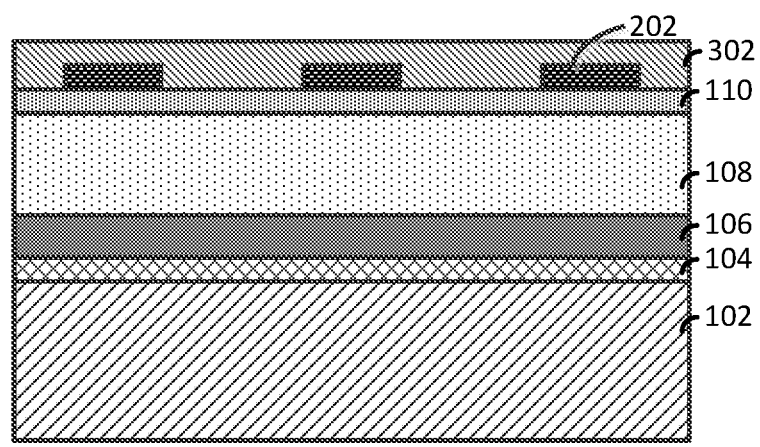

FIG. 3 illustrates a side view of the resultant structure following the formation of an adhesion layer 302 over exposed portions of the conductive contacts 202 and the third semiconductor layer 110. The adhesion layer 302 is optional, thus, in alternate exemplary embodiments, the adhesion layer 302 may not be included. In the illustrated exemplary embodiment, the adhesion layer 302 includes, for example, Ti, NiTi, Cr, or TiW.

Figure 4:
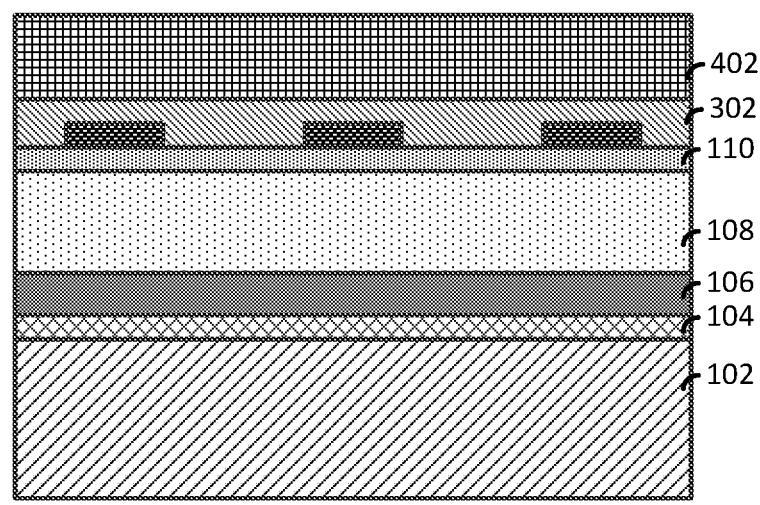

FIG. 4 illustrates a side view of the resultant structure following the formation of a stressor layer 402 comprising, for example, Ni that has been deposited using physical vapor deposition (e.g., sputtering) or electrically plated or combinations thereof. The stressor layer 402 is formed over exposed portions of the adhesion layer 302. The thickness of the stressor layer 402 may be between about 5 and 50 µm where the stressor layer 402 has a stress value between about 250 and 800 MPa (tensile).

Figure 5:
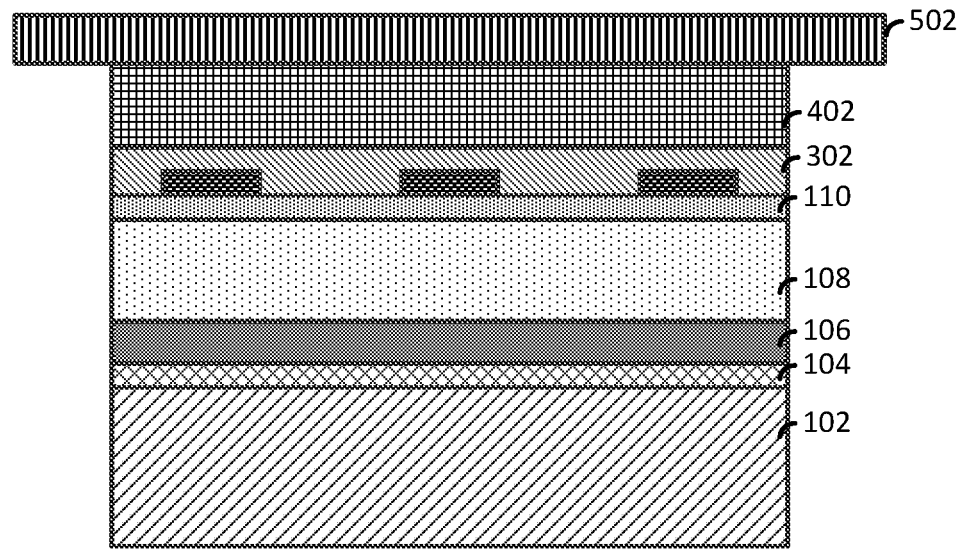

FIG. 5 illustrates a side view of the resultant structure following the formation of a handle layer 502 over exposed portions of the stressor layer 402. The handle layer 502 may include, for example, a metal foil or a polymeric tape such as polyimide (PI), polyvinylchloride (PVC), or polyolefin (PO) based tape. The handle layer 502 may have a thickness of about 10 to 200 µm.

Figure 6:
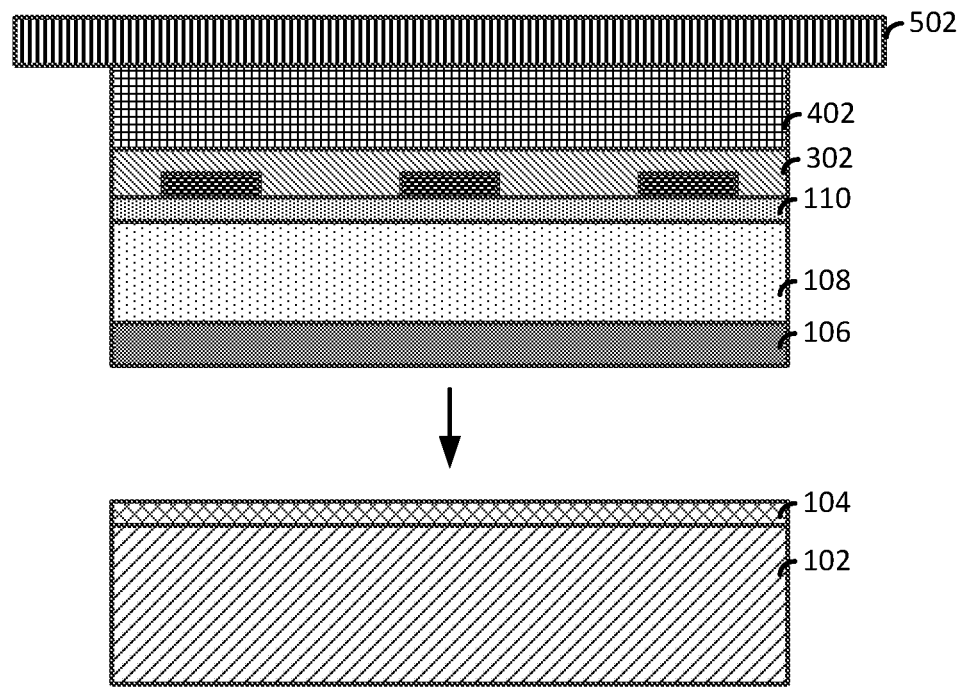

FIG. 6 illustrates a side view of the resultant structure following a spalling process that separates the substrate 102 and the transition layer 104 from the first semiconductor layer 106. The spalling process is a mechanical process whereby a fracture is forced to occur below, and parallel to, the interface between stressor layer 402 and the third semiconductor layer 110. The energy that drives the fracture comes from the elastic energy stored in the stressor layer 402. For example, for thinner stressor layer 402 values, a higher tensile stress value is preferred and while for thicker stressor layer 402 values, a lower tensile stress value is preferred. The role of the handle layer 502 is to initiate and guide a singular fracture front for controlled mechanical separation. Following the spalling process, the substrate 102 and the transition layer 104 may be discarded or reused in a subsequent process.

Figure 7:
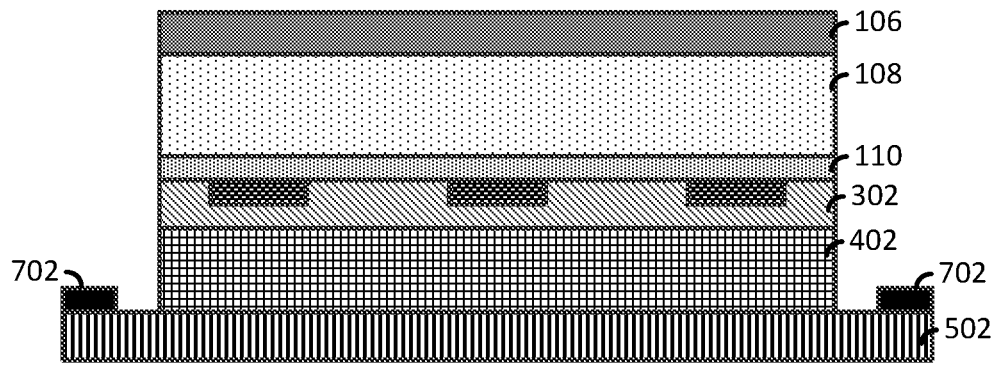

FIG. 7 illustrates a side view of the resultant structure where the remaining handle layer 502, the stressor layer 402, the adhesion layer 302, the conductive contacts 202, the first semiconductor layer 106, the second semiconductor layer 108, and the third semiconductor layer 110 have been rotated or flipped, and a frame 702 has been secured to the handle 502. Frame 702 may include a rigid or semi-rigid material, which attaches to the handle layer 502 in such a manner that restricts the tendency of spalled film stack to curl. An exemplary method of attaching frame 702 includes keeping the spalled film stack flat using a vacuum chuck, and mounting the frame 702 to the handle layer 502 on the exposed periphery.

Figure 8:
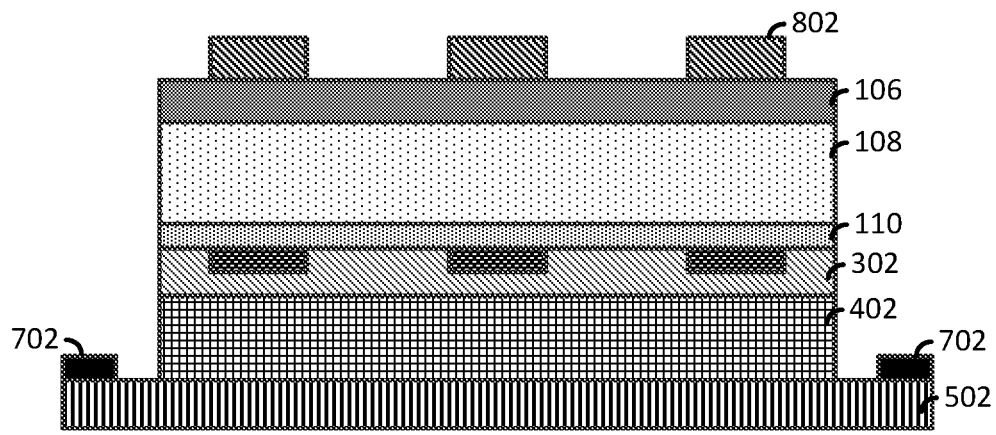

FIG. 8 illustrates a side view of the resultant structure following the deposition and patterning of contact or masking regions 802. The regions 802 may include conductive material, for example, Ti/Ag or W/Ag. In alternate exemplary embodiments the regions 802 may include masking material such as, for example, silicone, wax, or a resist material. The regions 802 may be formed by, for example, a suitable deposition and lithographic patterning and etching process.

Figure 9:
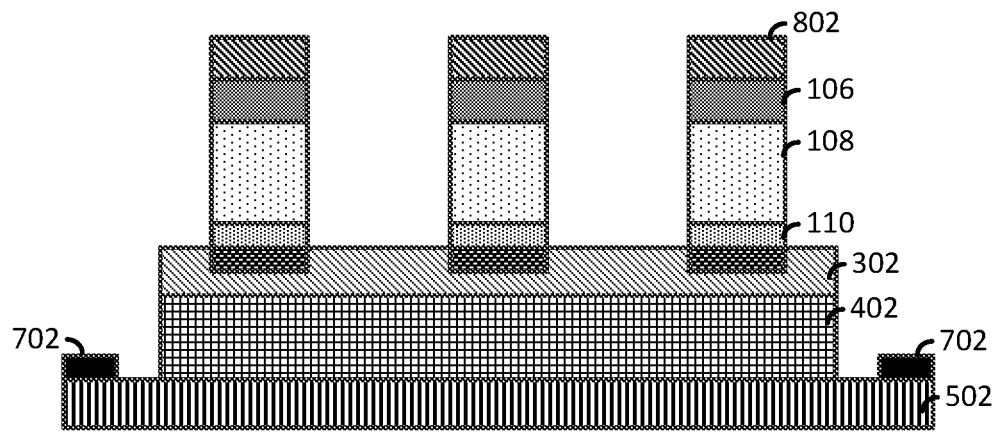
Figure 10:
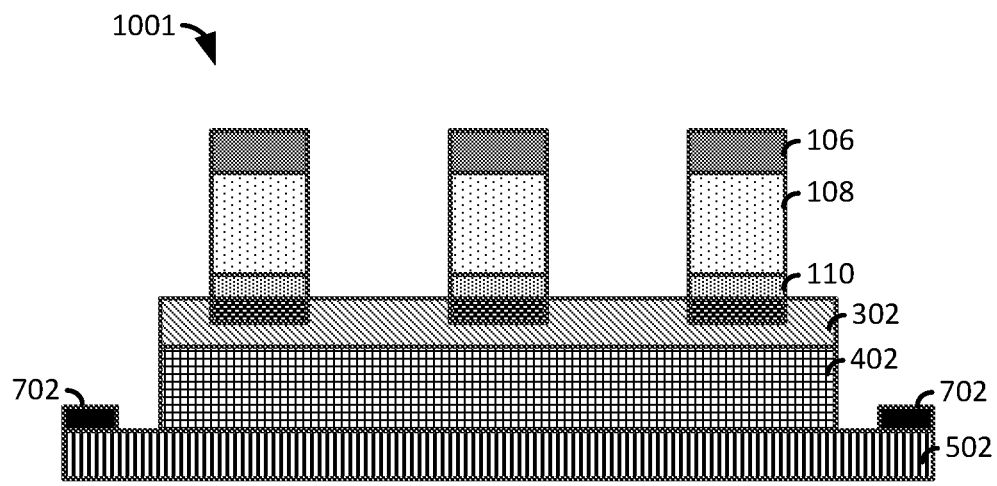
FIG. 10 Illustrates a side view of an exemplary embodiment of a semiconductor device.

FIG. 9. Illustrates a side view of the resultant structure following an anisotropic etching process that removes exposed portions of the first semiconductor layer 106, the second semiconductor layer 108, and the third semiconductor layer 110 to expose portions of the underlying stressor layer 302. The etching process may include any suitable etching process such as, for example, hot $H_3PO_4$, KOH, NaOH etching. The etching results in the semiconductor device 1001 shown in FIG. 10.

Figure 11:
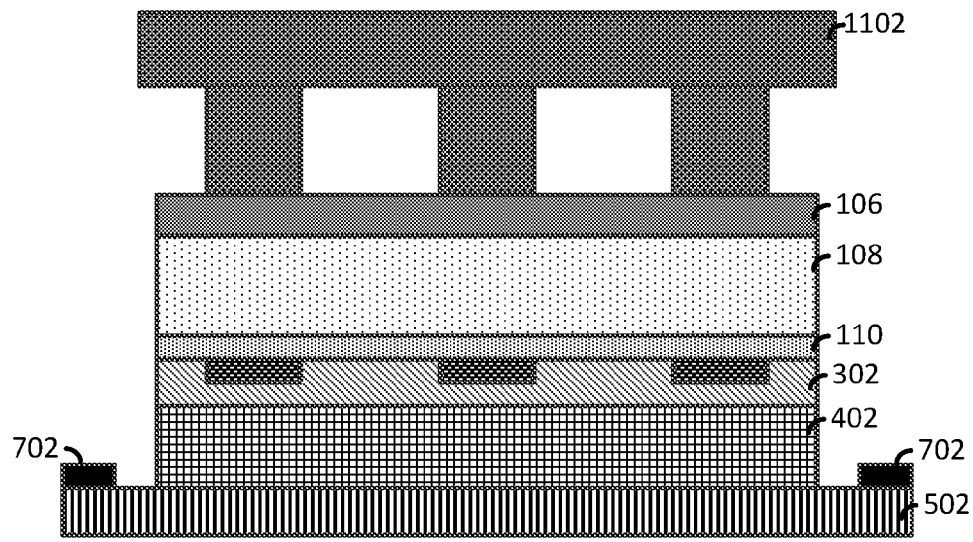
FIGS. 11-13 illustrate an alternate exemplary method for fabricating the semiconductor device
Figure 12:
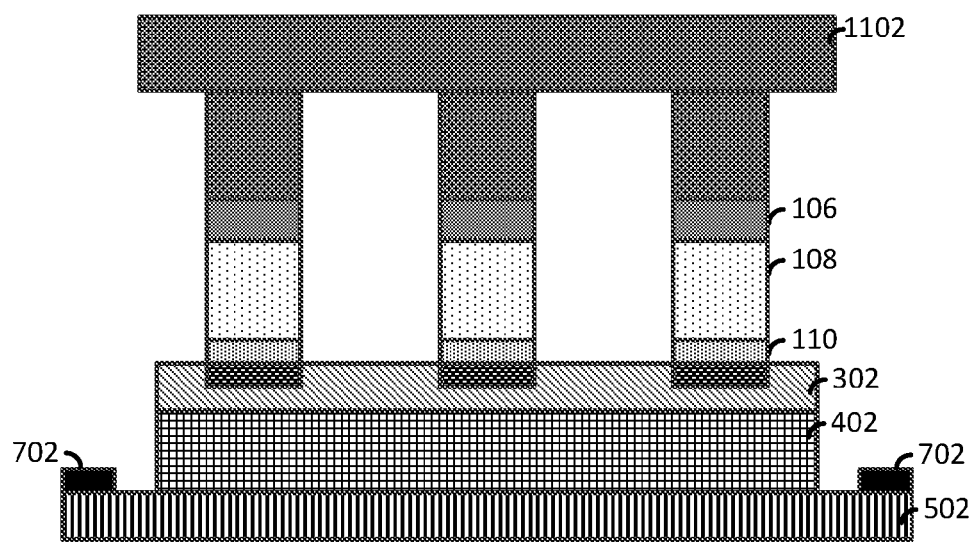
Figure 13:
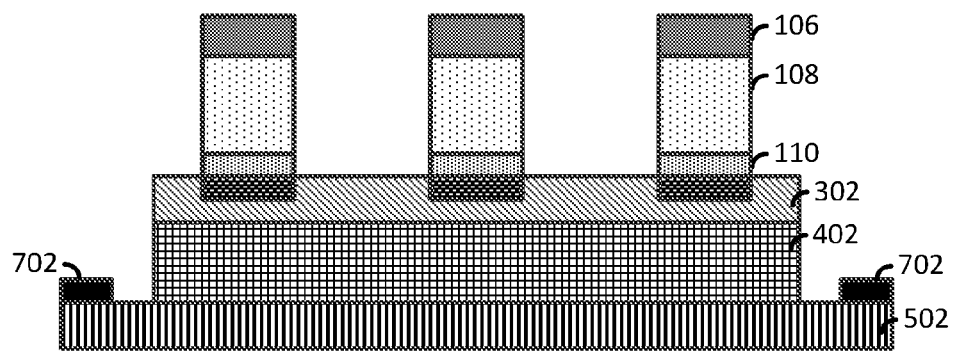

FIGS. 11-13 illustrate an alternate exemplary method for fabricating the semiconductor device 1001. In this regard, in FIG. 11, shows a side view of a contact stamp 1102 is arranged in contact with the first semiconductor layer 106.

FIG. 12 illustrates a side view of the resultant structure following a suitable etching process such as the processes described above in FIG. 9, which removes exposed portions of the first semiconductor layer 106, the second semiconductor layer 108, and the third semiconductor layer 110 to expose portions of the underlying stressor layer 302.

FIG. 13 illustrates a side view of the resultant structure following the removal of the contact stamp 1102 (of FIG. 12).

Figure 14:
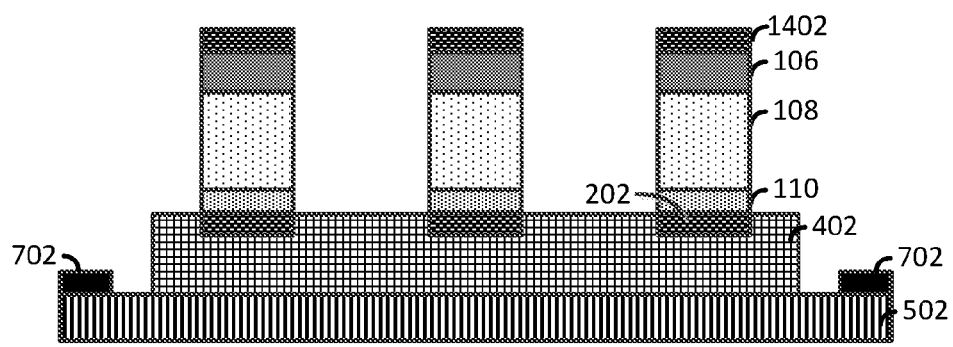
FIG. 14 illustrates a side view of an alternate exemplary embodiment of a device.

FIG. 14 illustrates a side view of an alternate exemplary embodiment of a device 1401. The device 1401 is similar to the device 1001 (of FIG. 10) described above however, the adhesion layer 302 has been omitted from the device 1401. Thus, the stressor layer 402 has been formed over the third semiconductor layer 110 following the formation of the contacts 202.

Figure 15:
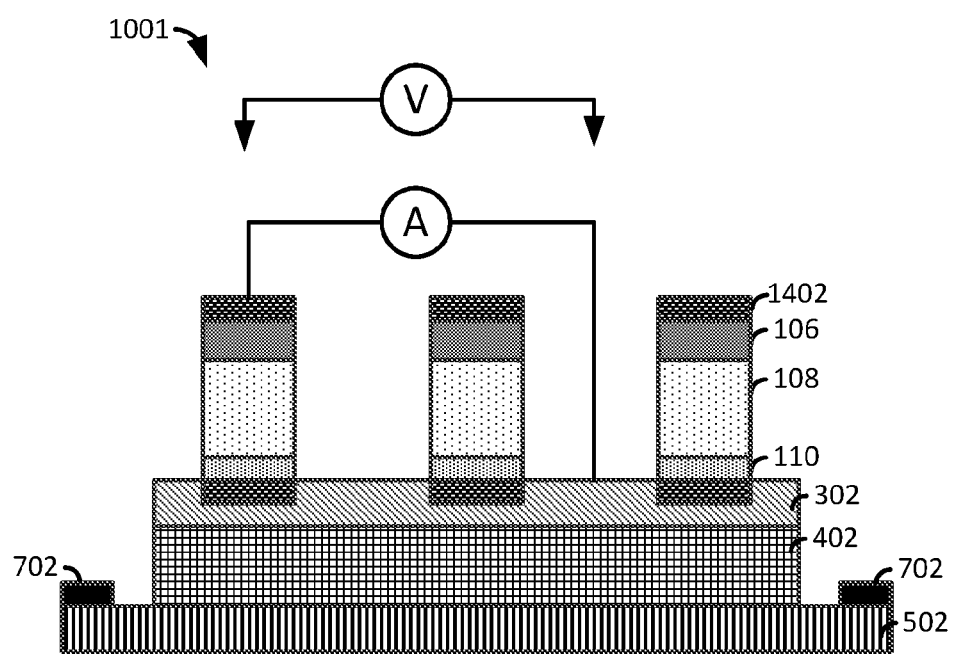
FIG. 15 illustrates a side view of the device showing the measurement of a current (A) and a voltage (V) across the device.

FIG. 15 illustrates a side view of the device 1001. Showing the measurement of a current (A) and a voltage (V) across the device 1001.

Figure 16:
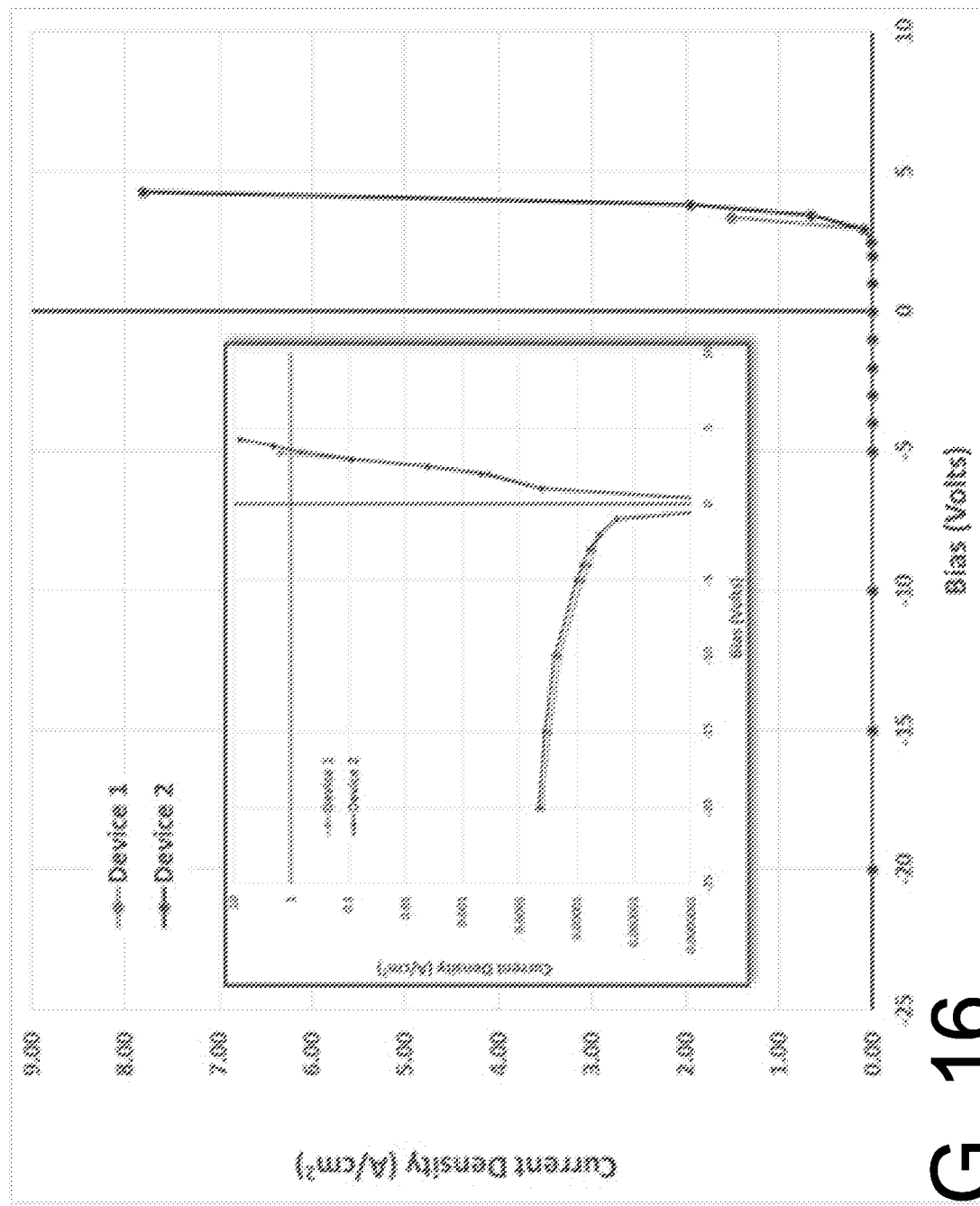
FIG. 16 illustrates a graph showing the performance of the device of FIG. 15.

FIG. 16 illustrates a graph showing the performance of the device 1001 (of FIG. 15). The graph of FIG. 16 includes data taken from GaN PIN diodes grown on 2" sapphire substrates and processed in accordance with the embodiments described herein. Spalling was performed using a 25 µm Ni layer, which removed the 9 µm thick GaN device layers from the sapphire wafer as a single, continuous layer. The devices were singulated by masking the device areas with a layer of silicone (FIG. 8, regions 802) and etching the unprotected regions using 180° C. $H_3PO_4$ (FIG. 9). Current-Voltage characteristics taken from the resulting devices (FIG. 15) (5 mm² contacts 202) show normal diode operation with a forward voltage of ~3V, and low reverse bias (parasitic) leakage as indicated by the inset graph plotted in logarithmic scale.

The methods and resultant structures described herein provide for high-power devices having GaN materials that are etched without near-surface damage to the GaN lattice, which reduces parasitic leakage in the devices. The resultant devices also have space for electrical and thermal contact to the underside of the devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor device, the method comprising:
    depositing a transition layer on a substrate;
    depositing GaN material on the transition layer;
    forming a contact on the GaN material;
    depositing a stressor layer on the GaN material such that the contact is between the stressor layer and the GaN material;
    separating the transition layer and the substrate from the GaN material; and
    patterning and removing portions of the GaN material to expose portions of the stressor layer.

2. The method of claim 1, further comprising forming a handle layer on the stressor layer prior to separating the transition layer and the substrate from the GaN material.

3. The method of claim 2, further comprising securing a frame to the handle layer.

4. The method of claim 1, further comprising depositing an adhesion layer on the GaN material after forming the contact.

5. The method of claim 1, wherein the GaN material includes:
    a first semiconductor layer on the transition layer
    a second semiconductor layer on the first semiconductor layer; and
    a third semiconductor layer on the second semiconductor layer.

6. The method of claim 5, wherein the first semiconductor layer includes an n-type doped GaN material, the second semiconductor layer includes an undoped GaN material, and the third semiconductor material includes a p-type doped GaN material.

7. A method for fabricating a semiconductor device, the method comprising:
    depositing a transition layer on a substrate;
    depositing GaN material on the transition layer;
    forming contacts on the GaN material;
    depositing a stressor layer on the GaN material;
    separating the transition layer and the substrate from the GaN material; and
    patterning and removing portions of the GaN material to expose portions of the stressor layer,
    wherein the patterning and removing portions of the GaN material to expose portions of the stressor layer includes patterning to form the contacts on the GaN material.

8. A method for fabricating a semiconductor device, the method comprising:
    depositing a transition layer on a substrate;
    depositing a first semiconductor layer on the transition layer;
    depositing a second semiconductor layer on the first semiconductor layer;
    depositing a third semiconductor layer on the second semiconductor layer;
    forming a contact on the third semiconductor layer;
    depositing a stressor layer on the third semiconductor layer such that the contact is between the stressor layer and the third semiconductor layer;
    separating the transition layer and the substrate from the first semiconductor layer; and
    removing portions of the first semiconductor layer, the second semiconductor layer, and the third semiconductor layer to expose portions of the stressor layer.

9. The method of claim 8, wherein prior to removing portions of the first semiconductor layer, the second semiconductor layer, and the third semiconductor layer, a second contact is patterned on the first semiconductor layer.

10. The method of claim 8, wherein prior to removing portions of the first semiconductor layer, the second semiconductor layer, and the third semiconductor layer, a mask is patterned on the first semiconductor layer.

11. The method of claim 8, further comprising depositing an adhesion layer on the third semiconductor layer prior to depositing the stressor layer.

12. The method of claim 8, wherein the first semiconductor layer, the second semiconductor layer, and the third semiconductor layer include a GaN material.

13. The method of claim 8, wherein the first semiconductor layer includes an n-type doped GaN material.

14. The method of claim 8, wherein the second semiconductor layer includes an undoped GaN material.

15. The method of claim 8, wherein the third semiconductor layer includes a p-type doped GaN material.

16. The method of claim 8, further comprising forming a handle layer on the stressor layer prior to separating the transition layer and the substrate from the first semiconductor layer.

17. The method of claim 16, further comprising securing a frame to the handle layer following the separating the transition layer and the substrate from the first semiconductor layer.

18. The method of claim 8, wherein the stressor layer includes Ni material.

* * * * *